(12) United States Patent
De-La-Fuente et al.

(10) Patent No.: US 11,466,831 B2
(45) Date of Patent: Oct. 11, 2022

(54) PRINTED CIRCUIT BOARD, CARD EDGE CONNECTOR SOCKET, ELECTRONIC ASSEMBLY AND AUTOMOTIVE LIGHTING DEVICE

(71) Applicant: VALEO ILUMINACION, Martos (ES)

(72) Inventors: Jose Alberto De-La-Fuente, Martos (ES); Lorenzo Jurado, Martos (ES); Ricardo Fernandez, Martos (ES); Jose-David Roldan, Martos (ES)

(73) Assignee: VALEO ILUMINACION, Martos (ES)

( * ) Notice: Subject to any disclaimer, the term of this patent is extended or adjusted under 35 U.S.C. 154(b) by 0 days.

(21) Appl. No.: 16/438,659

(22) Filed: Jun. 12, 2019

(65) Prior Publication Data

US 2019/0383455 A1    Dec. 19, 2019

(30) Foreign Application Priority Data

Jun. 13, 2018   (EP) .................................... 18382419

(51) Int. Cl.
*F21S 41/141* (2018.01)
*F21S 41/24* (2018.01)
(Continued)

(52) U.S. Cl.
CPC .............. *F21S 41/141* (2018.01); *F21S 41/24* (2018.01); *F21S 41/285* (2018.01); *F21V 19/0015* (2013.01); *H05K 1/11* (2013.01)

(58) Field of Classification Search
CPC ........ F21S 41/141; F21S 41/24; F21S 41/285; F21V 19/0015; H05K 1/11
See application file for complete search history.

(56) References Cited

U.S. PATENT DOCUMENTS 4,241,381 A * 12/1980 Cobaugh .............. H05K 7/1457
                                                        361/624
5,319,523 A *  6/1994 Ganthier ................ H05K 1/117
                                                         439/59
(Continued)

FOREIGN PATENT DOCUMENTS

EP             3 327 165 A1    5/2018

OTHER PUBLICATIONS

European Search Report dated Dec. 3, 2018 in European Application 18382419.2 filed on Jun. 13, 2018.
(Continued)

*Primary Examiner* — Rajarshi Chakraborty
*Assistant Examiner* — Nathaniel J Lee
(74) *Attorney, Agent, or Firm* — Oblon, McClelland, Maier & Neustadt, L.L.P.

(57) ABSTRACT

An IMS printed circuit board comprises a card edge connector with a first face and a second face, the second face being in electric contact with the metallic core and the card edge connector comprising a plurality of signal traces. At least one of the signal traces is a ground trace which is in electrical connection with a ground connection of the printed circuit board and is intended to be connected to a ground pin comprised in a card edge connector socket. The IMS printed circuit board also provides a card edge connector socket with a plurality of pins, one of the pins being a ground pin and being configured to receive the ground trace of the printed circuit board. An electronic assembly comprises the printed circuit board and the card edge connector socket and a lighting device are also provided.

16 Claims, 3 Drawing Sheets

(51) Int. Cl.
*F21S 41/20* (2018.01)
*F21V 19/00* (2006.01)
*H05K 1/11* (2006.01)

(56) References Cited

U.S. PATENT DOCUMENTS

| | | | | |
|---|---|---|---|---|
| 5,764,489 | A * | 6/1998 | Leigh | H05K 1/0228 |
| | | | | 361/783 |
| 2004/0016569 | A1* | 1/2004 | Mix | H05K 1/117 |
| | | | | 174/261 |
| 2006/0203455 | A1* | 9/2006 | Suzuki | H05K 3/4092 |
| | | | | 361/720 |
| 2014/0111894 | A1* | 4/2014 | Schug | F21S 41/141 |
| | | | | 438/34 |
| 2015/0364846 | A1* | 12/2015 | Chen | H01R 12/79 |
| | | | | 439/497 |

OTHER PUBLICATIONS

European Office Action dated Nov. 4, 2021 in European Patent Application No. 18382419.2, 9 pages.
Chinese Office Action dated Feb. 25, 2022 in Chinese Application No. 201910514691.X with English translation, 13 pgs.

* cited by examiner

PRINTED CIRCUIT BOARD, CARD EDGE CONNECTOR SOCKET, ELECTRONIC ASSEMBLY AND AUTOMOTIVE LIGHTING DEVICE

TECHNICAL FIELD

This invention is related to the field of the manufacturing of the electronic assemblies in automotive lighting devices.

STATE OF THE ART

Electrostatic discharges (ESDs) are present in all environments. They especially affect metallic parts which are close to other elements with different charge. When printed circuit boards (PCB) are involved in an automotive lighting device, an ESD may cause the failure of the whole lighting device. This problem is usually solved by choosing a metallic part, such as the heatsink, and connecting it to ground, to avoid that an ESD may damage electronic elements present in PCB of such a lighting device.

There are many different ways of achieving this ground connection. One of them is using a conductive additional piece, which is usually welded or anyhow fixed to the PCB. This additional piece has a higher potential than the electronic element that needs to be protected (such as a LED in the PCB). When an ESD goes from the heatsink to the PCB, the additional piece absorbs the ESD and therefore the sensitive element of the PCB is protected.

In the event of insulated metallic substrate PCBs, the metallic core of the PCB is usually in contact with the heatsink of the lighting device. The additional piece crosses the PCB from the copper layer, where sensitive elements are arranged, through the dielectric layer and reaching the metallic core of the PCB.

An alternative solution to the aforementioned problem is sought, without the need of installing an additional conductive element crossing the PCB.

DESCRIPTION OF THE INVENTION

The invention provides an alternative solution for providing by means of a printed circuit board according to claim 1, a card edge connector socket according to claim 7, an electronic assembly according to claim 10 and an automotive lighting device according to claim 13. Preferred embodiments of the invention are defined in dependent claims.

Unless otherwise defined, all terms (including technical and scientific terms) used herein are to be interpreted as is customary in the art. It will be further understood that terms in common usage should also be interpreted as is customary in the relevant art and not in an idealised or overly formal sense unless expressly so defined herein.

In this text, the term "comprises" and its derivations (such as "comprising", etc.) should not be understood in an excluding sense, that is, these terms should not be interpreted as excluding the possibility that what is described and defined may include further elements, steps, etc.

In a first inventive aspect, the invention provides an insulated metallic substrate printed circuit board comprising
  a circuit layer;
  a metallic core;
  a dielectric layer between the circuit layer and the metallic core;
  a card edge connector having a first face and a second face, the second face being in electric contact with the metallic core,
  wherein the card edge connector comprises a plurality of signal traces,
  wherein at least one of the signal traces is a ground trace which is in electrical connection with a ground connection of the insulated metal substrate printed circuit board and is intended to be connected to a ground pin comprised in a card edge connector socket.

As the person skilled in the art may construe, an insulated metal substrate printed circuit board is a printed circuit board which comprises a circuit layer, a metallic core and a dielectric layer between the circuit layer and the metallic core. Standard PCBs has the circuit layer arranged directly on a plastics substrate, but in the event of the insulated metal substrate PCBs, the substrate is a metallic core, so a dielectric layer is required between the metallic core and the circuit layer.

This invention is suitable for achieving the connection of the ground signal to the ground connection of the insulated metal substrate printed circuit board by using a card edge connector and avoiding any additional component (such as a metallic contact or special plated tracks). This electrical connection improves the electrostatic discharge (ESD) protection, avoids electromagnetic compatibility (EMC) problems and reinforces the mechanical contact.

In some particular embodiments, the ground connection of the printed circuit board is a metallic element located in the circuit layer but is not in contact with the metallic core.

This avoids further mechanical operations such as crimping a bolt through the whole PCB.

In some particular embodiments, the signal traces comprise more than one ground trace. This redundancy is sometimes advisable, since ground connection is a basic feature for safety purposes.

In some particular embodiments, the signal traces are not present in the second face of the card edge connector.

Signal traces are responsible of transmitting the electric supply and/or data coming from the main connector to the elements contained in the printed circuit board. When these traces are only present in one face, the second face is only intended to provide the ground connection by means of the metallic core of the insulated metallic substrate printed circuit board.

In some particular embodiments, at least one of the signal traces is electrically connected to a light source.

This connection makes the printed circuit board useful for an automotive lighting device.

In some particular embodiments, the light source is a solid-state light source, such as light emitting diodes (LEDs).

The term "solid state" refers to light emitted by solid-state electroluminescence, which uses semiconductors to convert electricity into light. Compared to incandescent lighting, solid state lighting creates visible light with reduced heat generation and less energy dissipation. The typically small mass of a solid-state electronic lighting device provides for greater resistance to shock and vibration compared to brittle glass tubes/bulbs and long, thin filament wires. They also eliminate filament evaporation, potentially increasing the life span of the illumination device. Some examples of these types of lighting comprise semiconductor light-emitting diodes (LEDs), organic light-emitting diodes (OLED), or polymer light-emitting diodes (PLED) as sources of illumination rather than electrical filaments, plasma or gas.

In a further inventive aspect, the invention provides a card edge connector socket with a plurality of pins, one of the pins being a ground pin and being configured to receive the ground trace of the insulated metallic substrate printed circuit board according to the first inventive aspect.

This card edge connector is suitable for achieving a ground connection between the ground signal provided by the ground pin and the ground connection of the printed circuit board without a mechanical element that crosses through the PCB.

In some particular embodiments, the pins are arranged in two different rows, a first row intended to contact the first face of the card edge connector and a second row intended to contact the second face of the card edge connector.

This card edge structure provides a more robust connection than traditional pin connections.

In some particular embodiments, the second row only comprises ground connections.

Since the second row of the card edge connector socket is intended to contact the metallic core of the insulated metallic substrate printed circuit board, it is advantageous that this second row only comprises ground connections.

In a further inventive aspect, the invention provides an electronic assembly comprising a printed circuit board according to the first inventive aspect and a card edge connector socket according to the previous inventive aspect.

This electronic assembly achieves a reliable ground connection for a printed circuit board using a connection which does not require an external element installed in the printed circuit board, since the card edge connector of the printed circuit board may be manufactured just by a particular shaping of the edge of the printed circuit board.

In some particular embodiments, the second face of the card edge connector of the printed circuit board comprises ground connections and an electrically insulating material intended to avoid electric contact between the second face of the card edge connector and the second row of the card edge connector socket.

In the event the second row comprises some significant connections which are not ground connections, an electrically insulating material may be arranged to avoid electric contact between these significant connections and the metallic core, to avoid short-circuits.

In some particular embodiments, the second face of the card edge connector of the printed circuit board comprises a slot intended to avoid electronic connection between non-ground pins of the card edge connector socket and the second face of the card edge connector.

This is an alternative way of avoiding non-ground pins get in contact with the second face of the card edge connector, to avoid short-circuits between these non-ground pins.

In a further inventive aspect, the invention provides an automotive lighting device comprising an electronic assembly according to the previous inventive aspect.

This lighting device is suitable for being used in automotive applications, where electro-magnetic compatibility problems are crucial, since they may cause a total failure of the lighting device.

In some particular embodiments, the lighting device further comprises a first optical element arranged to receive light from the light source and to shape the light into a light pattern projected outside the lighting device.

An optical element is an element that has some optical properties to receive a light beam and emit it in a certain direction and/or shape, as a person skilled in automotive lighting would construe without any additional burden.

In some particular embodiments, the optical element is at least one of a light guide, a lens, a reflector or a collimator.

These optical elements are useful to manage the light produced by the light source and provide uniform outlet.

BRIEF DESCRIPTION OF THE DRAWINGS

To complete the description and in order to provide for a better understanding of the invention, a set of drawings is provided. Said drawings form an integral part of the description and illustrate an embodiment of the invention, which should not be interpreted as restricting the scope of the invention, but just as an example of how the invention can be carried out. The drawings comprise the following figures.

DETAILED DESCRIPTION OF THE INVENTION

Figure 1:
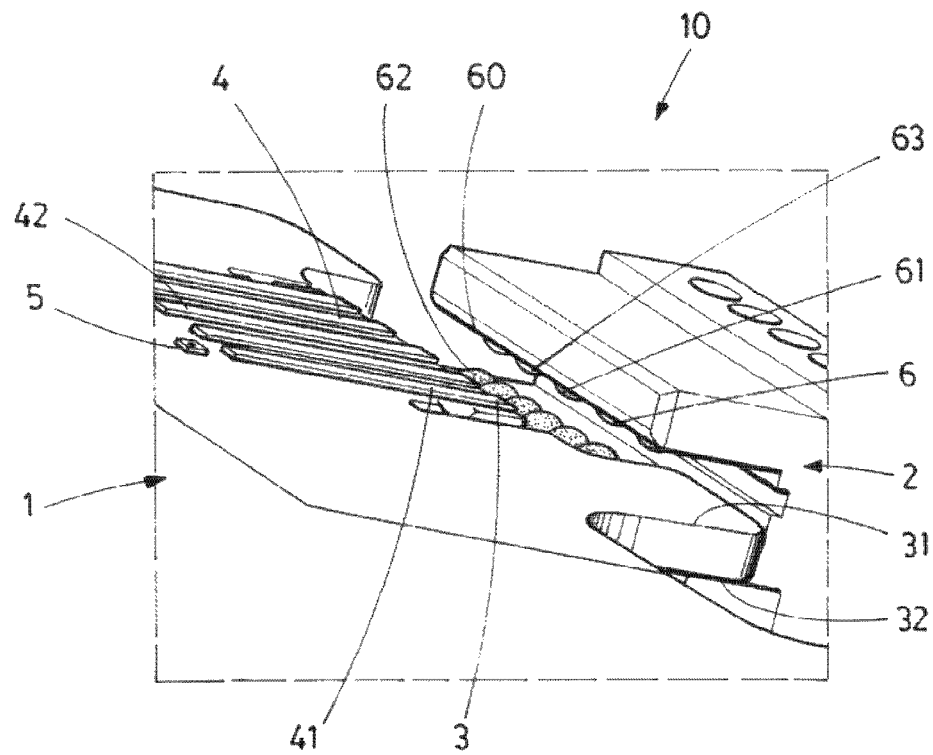
FIG. 1 shows a first embodiment of an electronic assembly according to the invention.

The example embodiments are described in sufficient detail to enable those of ordinary skill in the art to embody and implement the systems and processes herein described. It is important to understand that embodiments can be provided in many alternate forms and should not be construed as limited to the examples set forth herein.

Accordingly, while embodiment can be modified in various ways and take on various alternative forms, specific embodiments thereof are shown in the drawings and described in detail below as examples. There is no intent to limit to the particular forms disclosed. On the contrary, all modifications, equivalents, and alternatives falling within the scope of the appended claims should be included. Elements of the example embodiments are consistently denoted by the same reference numerals throughout the drawings and detailed description where appropriate.

FIG. 1 shows a first embodiment of an electronic assembly 10 according to the invention. This electronic assembly 10 comprises an insulated metallic substrate printed circuit board 1 and a card edge connector socket 2. The insulated metallic substrate printed circuit board 1 comprises a circuit layer, a metallic layer and a dielectric layer between the circuit layer and the metallic layer.

The printed circuit board 1 comprises a card edge connector 3 with a first face 31 and a second face 32. The second face is in electric connection with the metallic layer of the insulated metallic substrate printed circuit board. The card edge connector 2 also comprises a plurality of signal traces 4. These signal traces 4 are arranged in the first face 31 of the card edge connector 3.

One of these signal traces is a ground trace 41 which is in electrical connection with a ground connection of the printed circuit board 1. In different embodiments, more than one ground trace is provided. The rest of the signal traces 4 are the extensions of the conductive tracks 42 present in the printed circuit board 1, so some of them are connected to light sources 5, and are in charge of providing the light source 5 electrical supply and/or data.

In the particular embodiment shown in this figure, the light sources 5 are light emitting diodes, or LEDs.

The electronic assembly 10 also comprises a card edge connector 2 which comprises a plurality of pins 6 arranged in two different rows. The upper row 60 comprises a ground pin 61 which is intended to match with the ground trace 41 of the card edge connector 3 of the printed circuit board 1. The upper row 60 also comprises non-ground connections 63.

The upper row 60 is therefore intended to contact the first face 31 of the card edge connector 3 of the printed circuit board, while the lower row 62 is intended to contact the metallic core of the insulated metallic substrate printed circuit board 1. In this embodiment, the lower row 62 only comprises ground connections. A ground connection is therefore established between the heatsink, the ground connection of the card edge connector socket and the metallic core of the insulated metallic substrate printed circuit board.

Figure 2A:
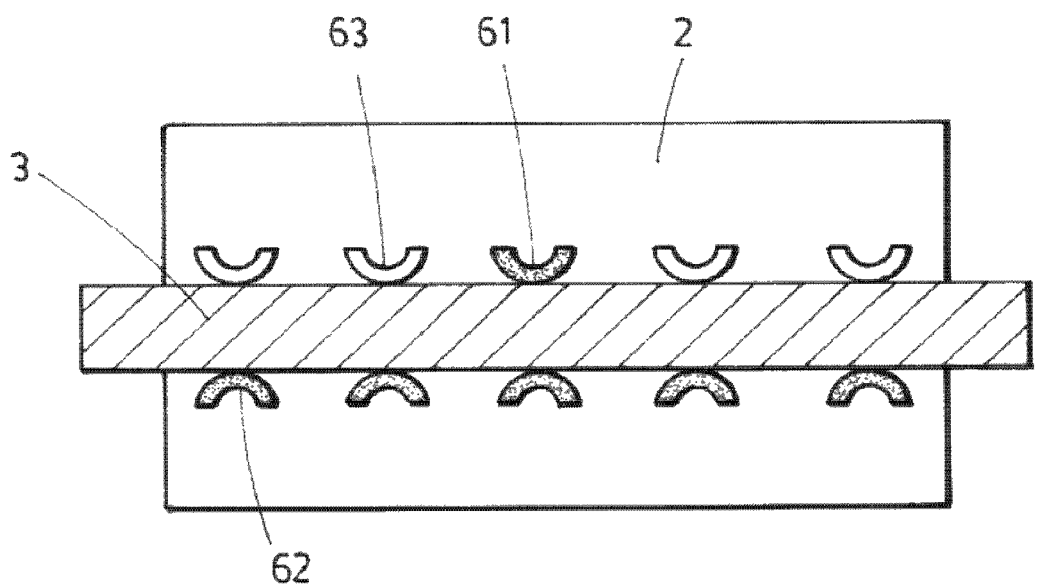
FIGS. 2a to 2c show different alternatives of embodying a card edge connection socket of an electronic assembly according to the invention.
Figure 2B:
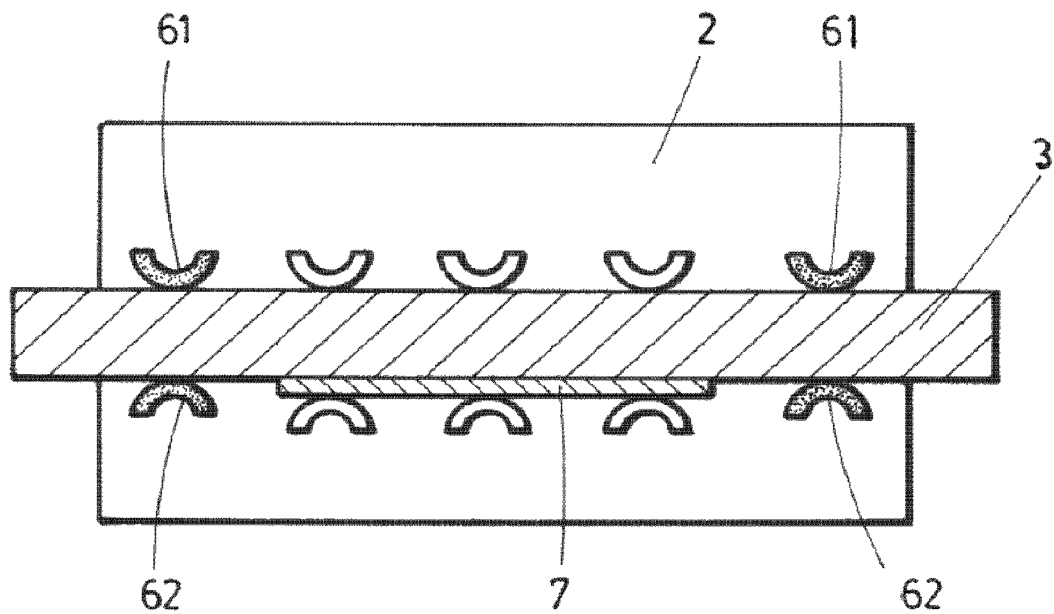
Figure 2C:
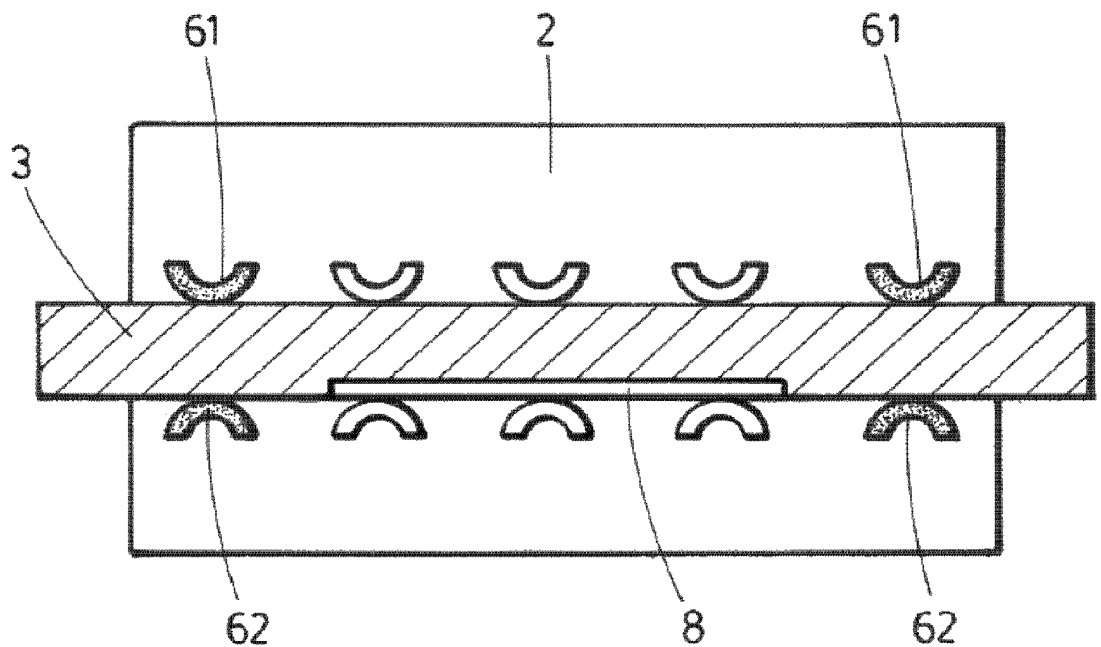

FIGS. 2a to 2c show different alternatives of arranging ground connections in different embodiments of card edge connector sockets according to the invention.

FIG. 2a shows the embodiment of FIG. 1, where all the pins comprised in the lower row 62 of the card edge connector socket 2 are ground pins 61.

FIG. 2b shows a different embodiment, where the lower row 62 of the card edge connector socket comprises some ground pins 61 but also non-ground pins 63. These non-ground pins 63 are isolated from the second face 32 of the card edge connector 3 by means of an dielectric interface 7 which is located in the second face 32 of the card edge connector 3, thus avoiding non-ground connection with the second face 32 of the card edge connector 3, which is in direct connection with the metallic core of the insulated metallic substrate printed circuit board. If this contact were made, a short-circuit between the non-ground pins 63 would occur.

FIG. 2c shows a third alternative in the arrangement of ground connections. In this embodiment, the second face 32 of the card edge connector 3 has a slot 8 which reduces the thickness of this face and therefore avoids contact between the non-ground pins 63 in the second row 62 of the card edge connector socket 2 and this second face 32.

Figure 3:
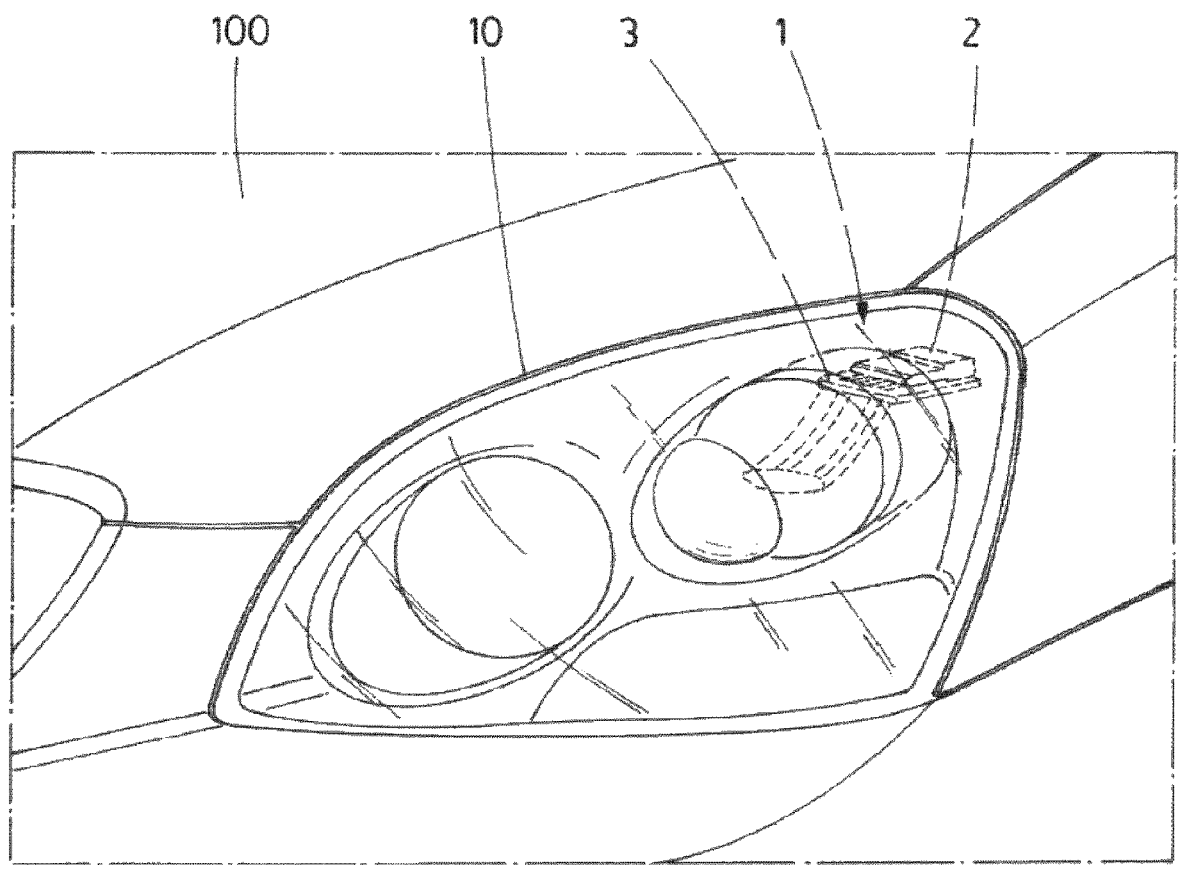
FIG. 3 shows a lighting device according to the invention installed in an automotive vehicle.

FIG. 3 shows an embodiment of an automotive lighting device 11 according to the invention installed in an automotive vehicle 100.

This automotive lighting device 11 comprises an electronic assembly 1 according to the invention, a reflector 91 arranged to receive light from a LED included in the electronic assembly 1 and to shape the light into a light pattern projected outside the luminous device. A projecting lens 92 is also arranged to project light received by the reflector 91.

This lighting device 11 is reliably connected to ground and offers a simple and robust design.

The invention claimed is:

1. An insulated metal substrate printed circuit board includes;
    a circuit layer;
    a metallic layer; and
    a dielectric layer between the circuit layer and the metallic layer, wherein
    an edge portion of the insulated metal substrate printed circuit board is shaped into a card edge connector, the card edge connector including an edge portion of the circuit layer of the insulated metal substrate printed circuit board, an edge portion of the metallic layer of the insulated metal substrate printed circuit board, and an edge portion of the dielectric layer between the edge portion of the circuit layer of the insulated metal substrate printed circuit board and the edge portion of the metallic layer of the insulated metal substrate printed circuit board,
    the circuit layer of the insulated metal substrate printed circuit board comprises a plurality of signal traces extending to the edge portion of the circuit layer, the signal traces connecting the card edge connector to elements contained in the insulated metal substrate printed circuit board,
    at least one of the plurality of signal traces is a ground trace, the ground trace being in electrical connection with a ground connection that is a metallic element located in the circuit layer of the insulated metal substrate printed circuit board, the ground trace being intended to be connected to a first ground pin comprised in a card edge connector socket,
    at least one of the plurality of signal traces is electrically connected to a light source arranged in the circuit layer,
    the metallic layer of the insulated metal substrate printed circuit board is connected to a heat sink contained in the insulated metal substrate printed circuit board and is intended to be connected to a second ground pin comprised in the card edge connector socket, and
    there is no conductive element that crosses the insulated metal substrate printed circuit board and connects the metallic layer and the circuit layer to provide a ground connection for electrostatic discharge between the circuit layer and the metallic layer.

2. The insulated metal substrate printed circuit board according to claim 1, wherein the plurality of signal traces comprise more than one ground trace.

3. The insulated metal substrate printed circuit board according to claim 1, wherein the plurality of signal traces are not present in the metallic layer of the card edge connector.

4. The insulated metal substrate printed circuit board according to claim 1, wherein the light source is a solid-state light source including a light emitting diode.

5. A card edge connector socket with a plurality of pins, one of the pins being a ground pin and being configured to receive the ground trace of the insulated metal substrate printed circuit board according to claim 1.

6. The card edge connector socket according to claim 5, wherein the pins are arranged in two different rows, a first row of the two different rows intended to contact the circuit layer of the card edge connector and a second row of the two different rows intended to contact the metallic layer of the card edge connector.

7. The card edge connector socket according to claim 6, wherein the second row only comprises ground connections.

8. An electronic assembly that includes an insulated metal substrate printed circuit board according to claim 1.

9. The electronic assembly according to claim 8, wherein the metallic layer of the card edge connector of the insulated metal substrate printed circuit board comprises ground connections and an electrically insulating material intended to avoid electric contact between the metallic layer of the card edge connector and the second row of the card edge connector socket.

10. The electronic assembly according to claim 8, wherein the metallic layer of the card edge connector of the insulated metal substrate printed circuit board comprises a slot intended to avoid electronic connection between non-ground pins of the card edge connector socket and the metallic layer of the card edge connector.

11. An automotive lighting device includes an electronic assembly according to claim 10.

12. The automotive lighting device according to claim 11, further comprising a optical element arranged to receive light from the light source and to shape the light into a light pattern projected outside the automotive lighting device.

13. The automotive lighting device according to claim 12, wherein the optical element is at least one of a lens, a light guide, a reflector or a collimator.

14. The electronic assembly according to claim 8, further comprising a card edge connector socket with a plurality of pins, one of the pins being a ground pin and being configured to receive the ground trace of the insulated metal substrate printed circuit board.

15. The insulated metal substrate printed circuit board according to claim 1, wherein the signal traces comprise more than one ground trace.

16. A card edge connector socket with a plurality of pins, one of the pins being a ground pin and being configured to receive the ground trace of the insulated metal substrate printed circuit board according to claim 1.

* * * * *